(12) United States Patent
Li et al.

(10) Patent No.: US 7,492,605 B2
(45) Date of Patent: Feb. 17, 2009

(54) POWER PLANE TO REDUCE VOLTAGE DIFFERENCE BETWEEN CONNECTOR POWER PINS

(75) Inventors: Yuan-Liang Li, Chandler, AZ (US);
Jayashree Kar, Saratoga, CA (US);
David G. Figueroa, Tolleson, AZ (US);
Dong Zhong, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 266 days.

(21) Appl. No.: 11/473,359

(22) Filed: Jun. 22, 2006

(65) Prior Publication Data

US 2007/0295818 A1      Dec. 27, 2007

(51) Int. Cl.
*H05K 1/11* (2006.01)
*H05K 1/00* (2006.01)

(52) U.S. Cl. ..................................... 361/792; 174/250
(58) Field of Classification Search ......... 361/792–795, 361/803; 174/250, 255, 261, 264
See application file for complete search history.

(56) References Cited

U.S. PATENT DOCUMENTS 6,424,555 B1 * 7/2002 Chang .......................... 365/63
6,727,435 B1 * 4/2004 Egan et al. .................. 174/250

* cited by examiner

*Primary Examiner*—Renee S Luebke
*Assistant Examiner*—Larisa Tsukerman
(74) *Attorney, Agent, or Firm*—Buckley, Maschoff & Talwalkar LLC

(57) ABSTRACT

A power plane including a supply power pin receptacle, a first connector power pin receptacle, and a second power pin receptacle, where a first electrical resistance between the supply power pin receptacle and the first connector power pin receptacle is substantially equal to a second electrical resistance between the supply power pin receptacle and the second connector power pin receptacle.

8 Claims, 8 Drawing Sheets

US 7,492,605 B2

POWER PLANE TO REDUCE VOLTAGE DIFFERENCE BETWEEN CONNECTOR POWER PINS

BACKGROUND

A computer motherboard may support a variety of computer components such as a voltage regulator, a memory module, and a processor. The motherboard may include a power plane that provides electrical connectivity between the components. For example, the power plane may be used to supply power from a voltage regulator to one or more memory modules. In this example, each memory module may be located at a different distance from the voltage regulator. Accordingly, respective electrical paths from each memory module to the voltage regulator may exhibit different electrical resistances.

Because of the different electrical resistances of the electrical paths, the voltage regulator may supply each memory module with a different supply voltage. Systems to efficiently address the foregoing are desired.

DETAILED DESCRIPTION

The several embodiments described herein are solely for the purpose of illustration. Embodiments may include any currently or hereafter-known versions of the elements described herein. Therefore, persons in the art will recognize from this description that other embodiments may be practiced with various modifications and alterations.

Figure 1:
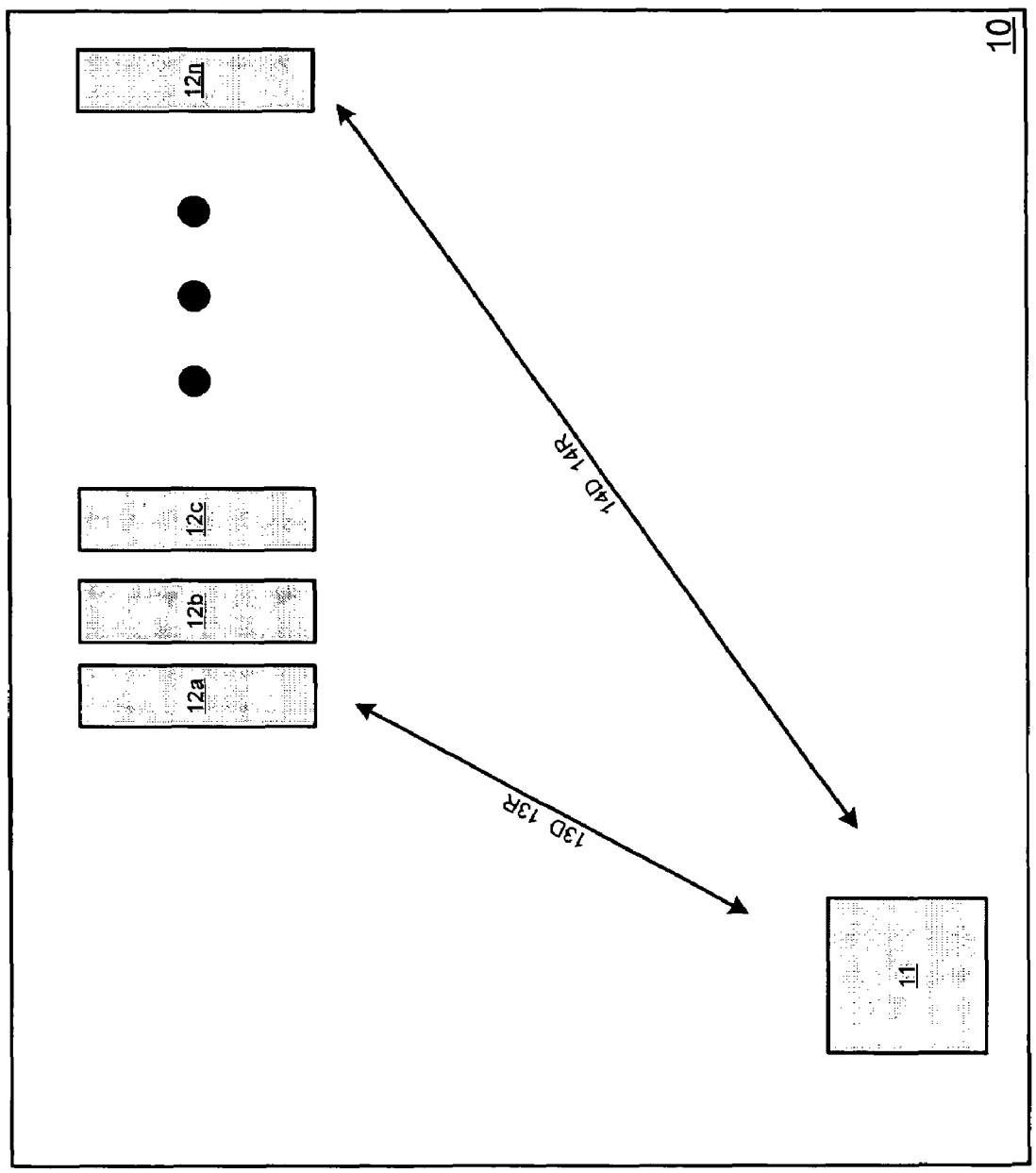
FIG. 1 is a block diagram of a system according to some embodiments.

Referring now to FIG. 1, an embodiment of a system is shown. The FIG. 1 system may be implemented in a computer server, a desktop or a handheld device but embodiments are not limited thereto. A motherboard 10 may support a variety of components such as a plurality of memory modules 12a through 12n and a voltage regulator 11. The motherboard 10 may also include a power plane (not shown) to carry power signals between components connected thereto.

Memory modules 12a through 12n may comprise any type of memory for storing data, such as a Single Data Rate Random Access Memory, a Double Data Rate Random Access Memory, a fully-buffered Dual In-line Memory Module, and a Programmable Read Only Memory.

The voltage regulator 11 may include a supply power pin that may be coupled to a supply power pin receptacle defined by the power plane of the motherboard 10. The voltage regulator 11 may be implemented as a voltage regulator "module" that is mounted to a substrate that in turn may be coupled to the motherboard 10, as a voltage regulator "down" having elements that are mounted directly on the motherboard 10, or in any other fashion.

Electrical signals may travel in a path between the above-mentioned supply power pin receptacle and a connector power pin receptacle that is also defined by the power plane of the motherboard 10. In this regard, each of memory modules 12a through 12n includes a connector power pin that may be used to receive power signals. Each connector power pin may be coupled to a respective connector power pin receptacle defined by the power plane of the motherboard 10.

A first distance 13D represents an electrical path between a connector power pin of a first memory module 12a and a supply power pin of the voltage regulator 11. The first distance 13D may exhibit a first electrical resistance 13R. Similarly, a second distance 14D represents an electrical path between a connector power pin of an Nth memory module 12n and the supply power pin of the voltage regulator 11. The second distance 14D may exhibit a second electrical resistance 14R. In some embodiments, the second resistance 14R may be substantially equal to the first resistance 13R and the second distance 14D may be greater than the first distance 13D.

Figure 2:
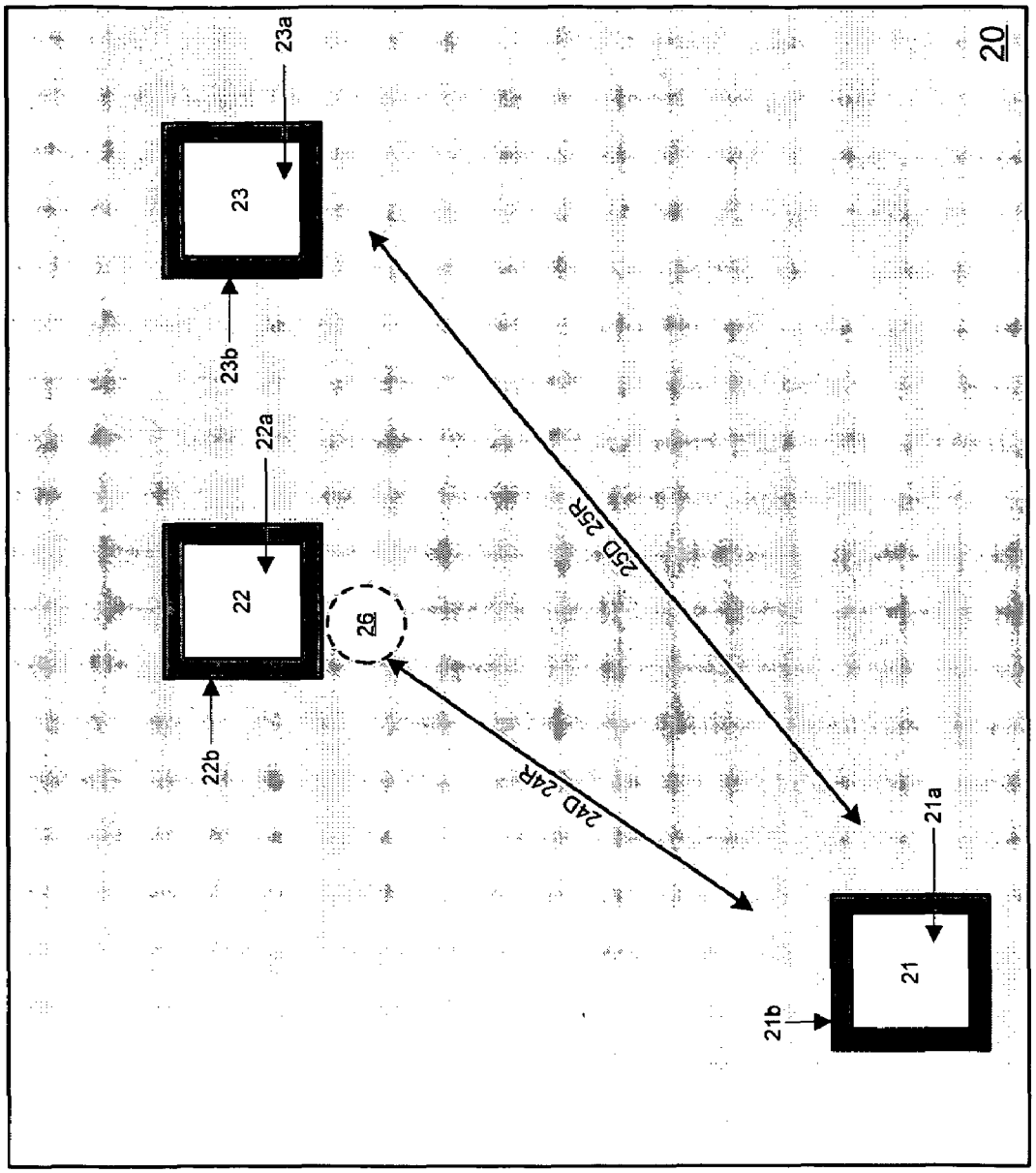
FIG. 2 is a block diagram of a power plane according to some embodiments.

Referring now to FIG. 2, an embodiment of a power plane 20 is shown. The power plane 20 may comprise a sheet of electrically-conductive material (e.g., copper). The power plane 20 may define a supply power pin receptacle 21, a first connector power pin receptacle 22, and a second connector power pin receptacle 23. As will be described with respect to FIG. 3, the power plane 20 may be an element of the motherboard 10.

As shown in FIG. 2, the supply power pin receptacle 21, the first connector power pin receptacle 22, and the second connector power pin receptacle 23 may be designed to hold a respective pin or connector such as a power pin. Receptacles 21/22/23 may consist of an inner non-conductive area 21a/22a/23a and a conductive outer area 21b/22b/23b. The outer area 21b/22b/23b contacts power plane 20 to provide an electrical connection between the power plane 20 and the held pin or connector. In one embodiment, outer areas 22b/23b of the first connector power pin receptacle 22 and the second connector power pin receptacle 23 may contact the power plane 20 to receive electrical power. Receptacles 21/22/23 may be square shaped, round shaped, or of any shape suitable for securing a corresponding pin or connector.

A first distance 24D of FIG. 2 represents an electrical path between the first connector power pin receptacle 22 and the supply power pin receptacle 21. The first distance 24D may exhibit a first electrical resistance 24R. Similarly, a second distance 25D represents an electrical path between the second connector power pin receptacle 23 and the supply power pin receptacle 21. The second distance 25D may exhibit a second electrical resistance 25R. In some embodiments, the second resistance 25R may be substantially equal to the first resistance 24R and the second distance 25D may be greater than the first distance 24D.

As described above, electrical paths between a voltage regulator and memory modules of a conventional system may exhibit different resistances. Accordingly, in some embodiments, a void 26 may be located between the first connector power pin receptacle 22 and the supply power pin receptacle 21 as shown in FIG. 2. The void 26 may increase the resistance associated with distance 24D. The size and shape of the void 26 may be selected such that the first resistance 24R is substantially equal to the second resistance 25R. The substantially equal resistances may result in a voltage at the connector power pin receptacle 22 that is substantially equal to a voltage at the connector power pin receptacle 23.

The void 26 may comprise a volume of the power plane 20 that includes a relative electrical insulator (e.g. dielectric material, air). In some embodiments, the void 26 is circular. The size of the void 26 may depend on a magnitude of the difference between the first resistance 24R and the second resistance 25R in the absence of the void 26.

Figure 3:
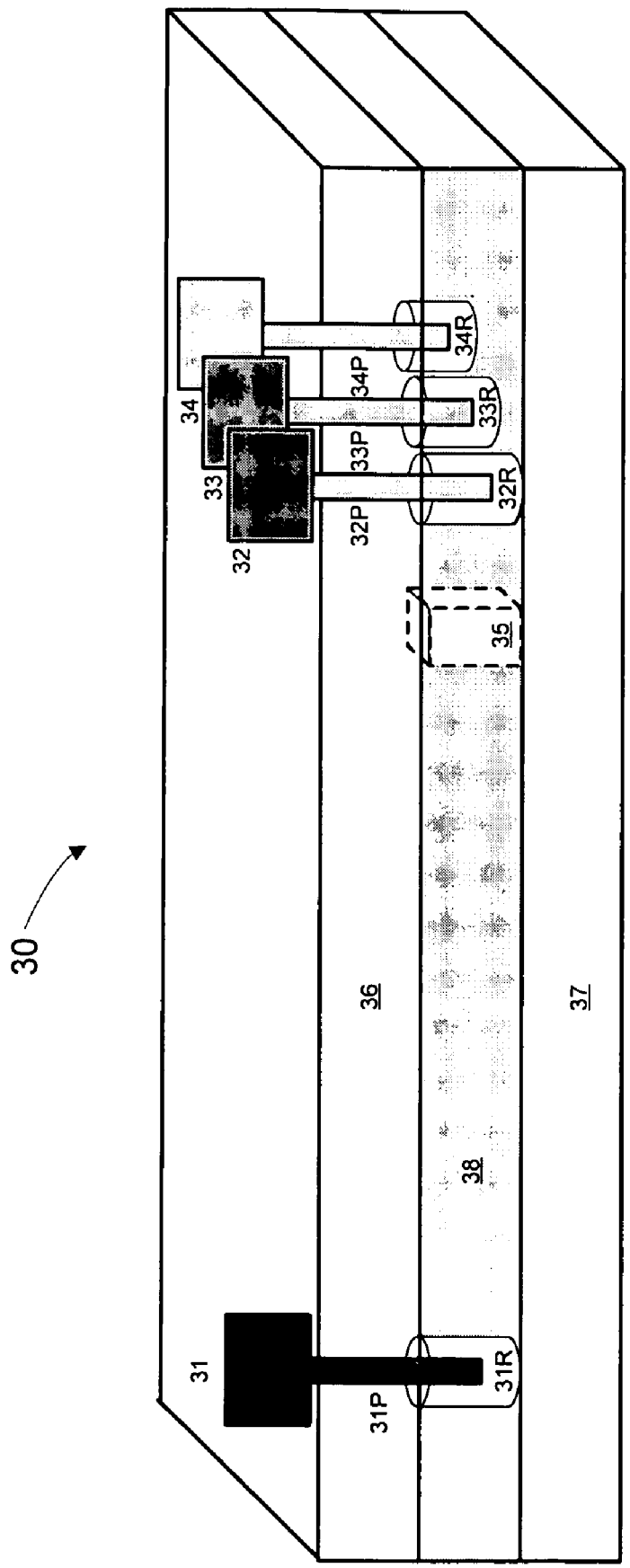
FIG. 3 is a block diagram of a circuit board according to some embodiments.

Referring now to FIG. 3, an embodiment of a circuit board 30 is shown. FIG. 3 is drawn for ease of description and should not be considered a scaled drawing. The circuit board 30 in some embodiments may be a motherboard such as motherboard 10. The circuit board 30 may support a variety of components. In some embodiments, the circuit board 30 may support a voltage regulator 31 and a plurality of memory modules 32, 33, and 34. The illustrated embodiment includes three memory modules, however, any number of memory modules may be used.

The circuit board 30 may be composed of several layers. In some embodiments, the circuit board 30 may include a first dielectric layer 36, a second dielectric layer 37, and a power plane 38. The power plane 38 may be disposed between the first dielectric layer 36 and the second dielectric layer 37. In some embodiments, the circuit board 30 may be composed of any number of layers including one or more ground planes, routing planes, and other power planes and intermediate dielectric layers.

The voltage regulator 31 may include a supply power pin 31P. The supply power pin 31P may be inserted within a supply power pin receptacle 31R defined by the power plane 38. Each memory module 32, 33, and 34 may include a connector power pin 32P, 33P, and 34P, respectively. Each connector power pin 32P, 33P, and 34P may be coupled to the power plane 38 via a respective connector power pin receptacle 32R, 33R, and 34R.

In some embodiments, the power plane 38 may define a void 35. The void 35 may be any shape or size and may be located between the supply power pin receptacle 31R and the third connector power pin receptacle 32R. The size, shape and location of the void 35 may be selected in order to provide substantially equal resistances between supply power pin receptacle 31R and each receptacle 32R, 33R, and 34R.

Figure 4:
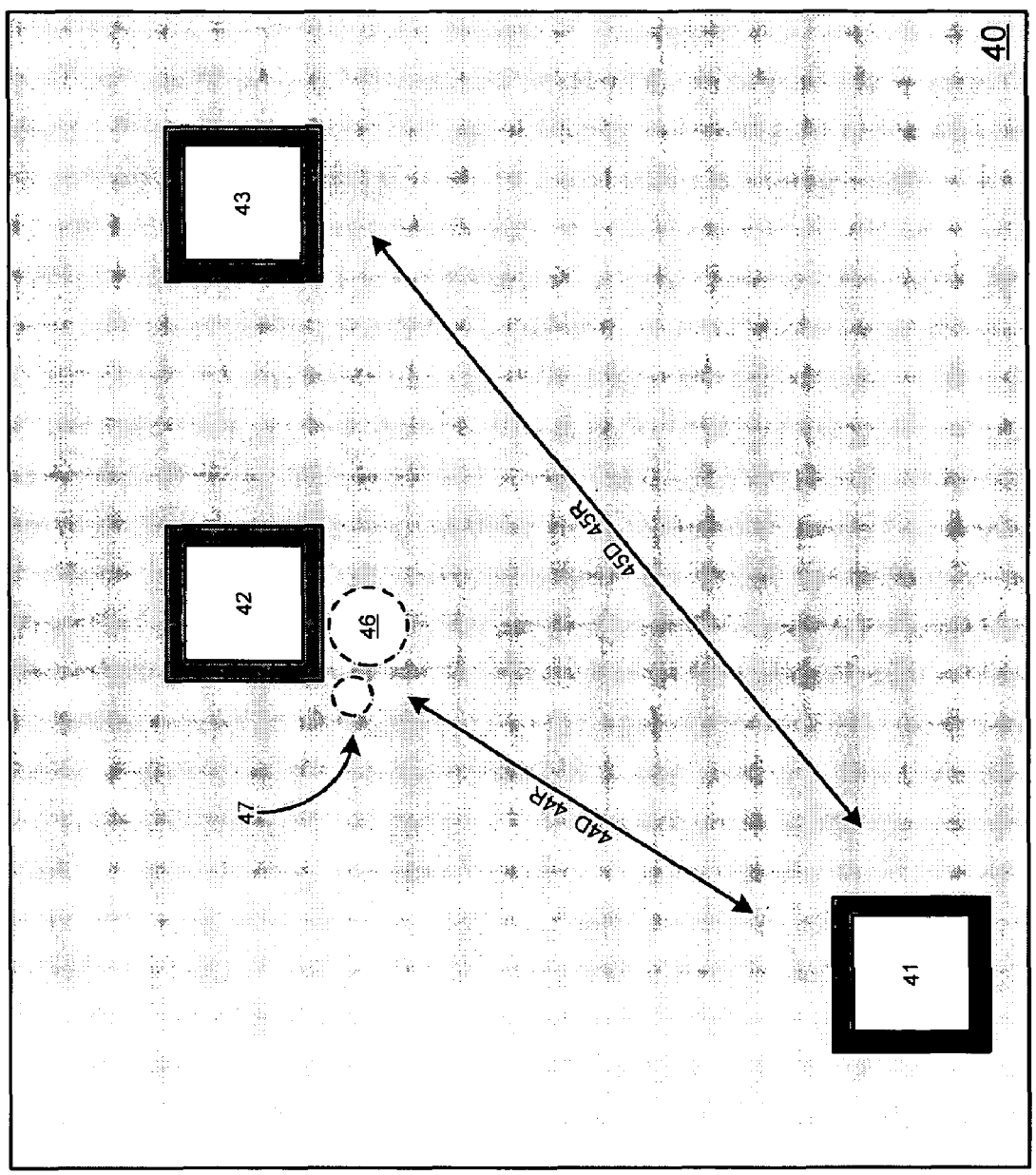
FIG. 4 is a block diagram of a power plane according to some embodiments.

Referring now to FIG. 4, an embodiment of a power plane 40 is shown. The power plane 40 may comprise a sheet of electrically-conductive material. The power plane 40 may define a supply power pin receptacle 41, a first connector power pin receptacle 42, and a second power pin receptacle 43. The power plane 40 may be an element of the motherboard 10.

A first distance 44D of FIG. 4 represents an electrical path between the first connector power pin receptacle 42 and the supply power pin receptacle 41. The first distance 44D may exhibit a first electrical resistance 44R. Similarly, a second distance 45D represents an electrical path between the second connector power pin receptacle 43 and the supply power pin receptacle 41. The second distance 45D may exhibit a second electrical resistance 45R. In some embodiments, the second resistance 45R may be substantially equal to the first resistance 44R and the second distance 45D may be greater than the first distance 44D.

In some embodiments, one or more voids 46 and 47 may be located between the first connector power pin receptacle 42 and the supply power pin receptacle 41 as shown in FIG. 4. The voids 46 and 47 may increase the resistance associated with distance 44D. As described with respect to FIG. 3, the size, shape and location of voids 46 and 47 may be selected in order to provide substantially equal resistances between supply power pin receptacle 41 and each of receptacles 42 and 43. The substantially equal resistances may result in a voltage at the connector power pin receptacle 42 that is substantially equal to a voltage at the connector power pin receptacle 43.

Figure 5:
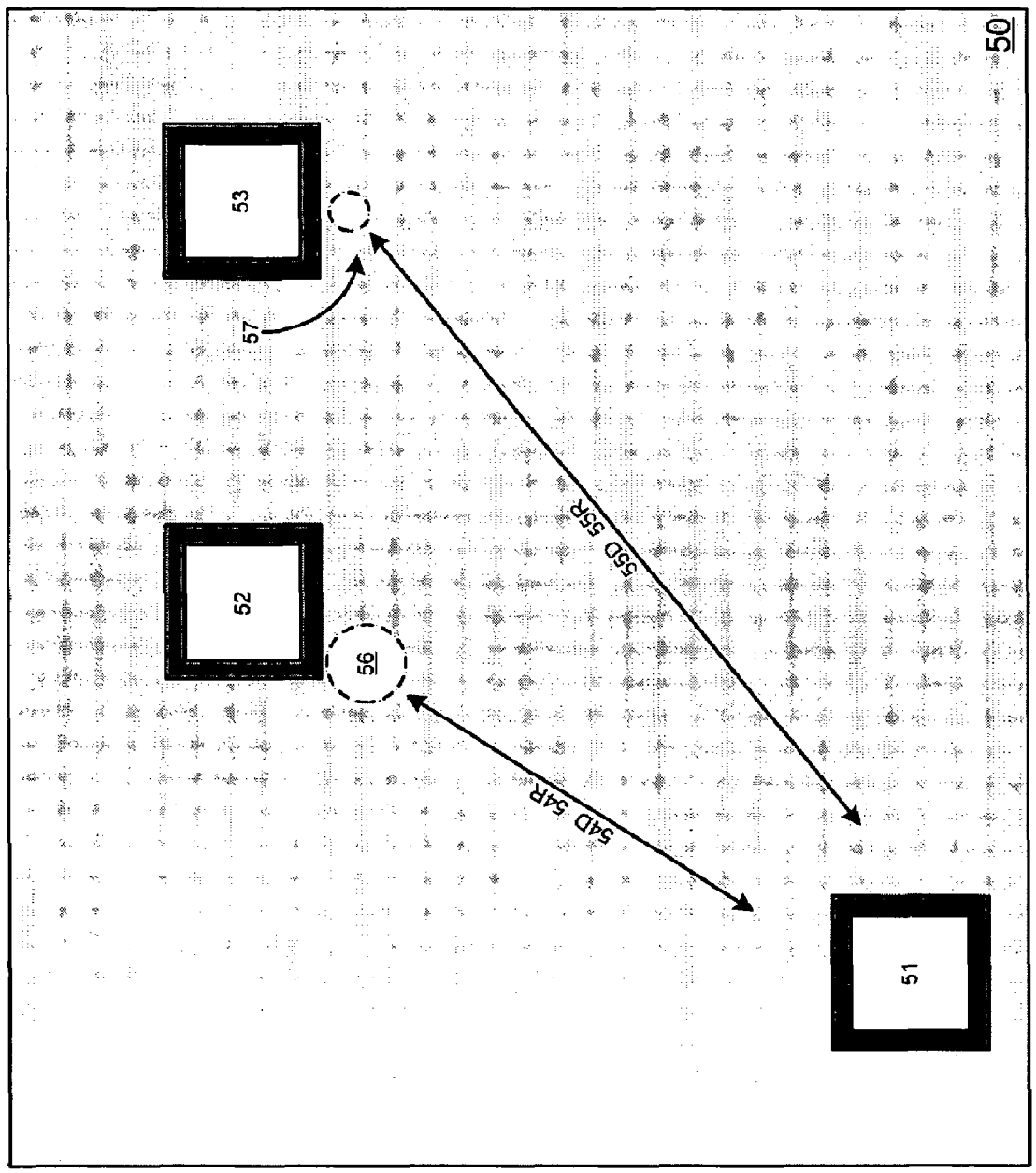
FIG. 5 is a block diagram of a power plane according to some embodiments.

Referring now to FIG. 5, an embodiment of a power plane 50 is shown. The power plane 50 may comprise a sheet of electrically-conductive material. The power plane 50 may define a supply power pin receptacle 51, a first connector power pin receptacle 52, and a second power pin receptacle 53. The power plane 50 may be an element of the motherboard 10.

A first distance 54D of FIG. 5 represents an electrical path between the first connector power pin receptacle 52 and the supply power pin receptacle 51. The first distance 54D may exhibit a first electrical resistance 54R. Similarly, a second distance 55D represents an electrical path between the second connector power pin receptacle 53 and the supply power pin receptacle 51. The second distance 55D may exhibit a second electrical resistance 55R. In some embodiments, the second resistance 55R may be substantially equal to the first resistance 54R and the second distance 55D may be greater than the first distance 54D.

In some embodiments, a first void 56 may be located between the first connector power pin receptacle 52 and the supply power pin receptacle 51 and a second void 57 may be located between the second connector power pin receptacle 53 and the supply power pin receptacle 51 as shown in FIG. 5. The first void 56 may increase the resistance associated with distance 54D. The second void 57 may increase the resistance associated with distance 55D. Again, the size, shape and location of voids 56 and 57 may be selected in order to provide substantially equal resistances between supply power pin receptacle 51 and each of receptacles 52 and 53.

The size and shape of the first void 56 may be selected such that the first resistance, 54R is substantially equal to the second resistance 55R. The size and shape of the second void 57 may be selected such that the first resistance 54R is substantially equal to the second resistance 55R. The substantially equal resistances may result in a voltage at the connector power pin receptacle 52 that is substantially equal to a voltage at the connector power pin receptacle 53.

Figure 6:
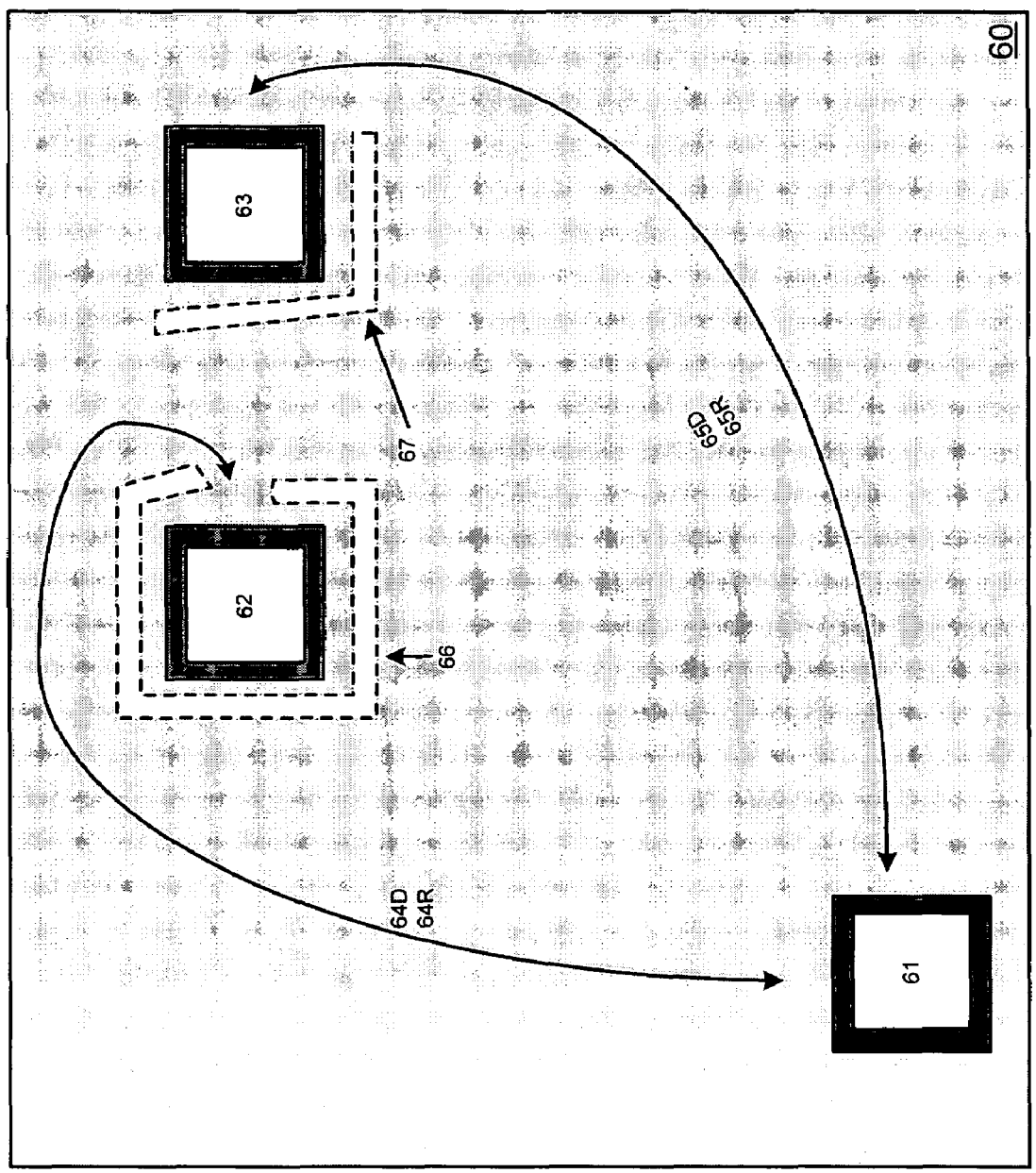
FIG. 6 is a block diagram of a power plane according to some embodiments.

An embodiment of a power plane 60 is shown in FIG. 6. The power plane 60 may comprise a sheet of electrically-conductive material and may define a supply power pin receptacle 61, a first connector power pin receptacle 62, and a second power pin receptacle 63. The power plane 60 may be an element of the motherboard 10.

A first distance 64D of FIG. 6 represents an electrical path between the first connector power pin receptacle 62 and the supply power pin receptacle 61 and a second distance 65D represents an electrical path between the second connector power pin receptacle 63 and the supply power pin receptacle 61. The first distance 64D may exhibit a first electrical resistance 64R, and the second distance 65D may exhibit a second electrical resistance 65R. According to some embodiments, the second resistance 65R may be substantially equal to the first resistance 64R and the second distance 65D may be greater than the first distance 64D.

In some embodiments, a first void 66 may be located between the first connector power pin receptacle 62 and the supply power pin receptacle 61 and a second void 67 may be located between the second connector power pin receptacle 63 and the supply power pin receptacle 61 as shown in FIG. 6. The size, shape and location of voids 66 and 67 may be selected in order to provide substantially equal resistances between supply power pin receptacle 61 and each of receptacles 62 and 63.

In some embodiments the first void 66 may border the first connector power pin receptacle 62 on more than one side. The second void 67 may increase the resistance associated with distance 65D. The size and shape of the void 67 may be selected such that the first resistance 64R may be substantially equal to the second resistance 65R. In some embodiments the voids 66 and 67 may border more than one side of their respective power pin receptacle. The substantially equal resistances may result in a voltage at the connector power pin receptacle 62 and 64 that is substantially equal to a voltage at the connector power pin receptacle 64. In some embodiments, the voids 66 and 67 have different shapes.

Figure 7:
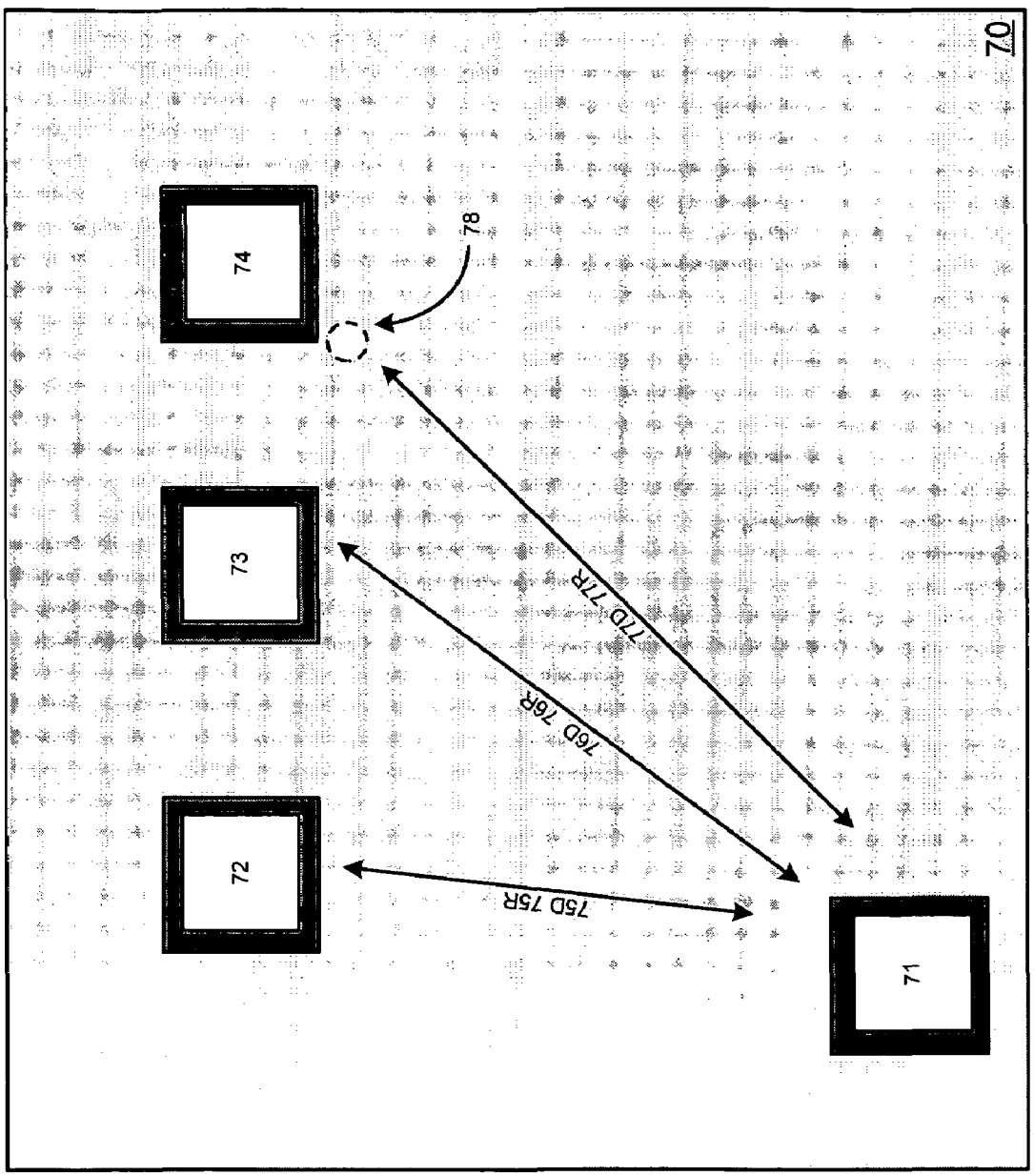
FIG. 7 is a block diagram of a power plane according to some embodiments.

FIG. 7 shows an embodiment of a power plane 70 which may comprise a sheet of electrically-conductive material. The power plane 70 may define a supply power pin receptacle 71, a first connector power pin receptacle 72, a second power pin receptacle 73, and a third power pin receptacle 74 and may be an element of the motherboard 10.

A first distance 75D of FIG. 7 represents an electrical path between the first connector power pin receptacle 72 and the supply power pin receptacle 71, and may exhibit a first electrical resistance 75R. An electrical path associated with a second distance 76D represents an electrical path between the second connector power pin receptacle 73 and the supply power pin receptacle 71, and may exhibit a second electrical resistance 76R. Lastly, an electrical path associated with a third distance 77D represents an electrical path between the third connector power pin receptacle 74 and the supply power pin receptacle 71 of the voltage regulator. The third distance 77D may exhibit a third electrical resistance 77R.

In some embodiments, a void 78 may be located between the third connector power pin receptacle 74 and the supply power pin receptacle 71 as shown in FIG. 7. The void 78 may increase the resistance associated with distance 77D. The size, shape, and location of the void 78 may be selected such that the first resistance 75R is substantially equal to the third resistance 77R. The substantially equal resistances may result in a voltage at the connector power pin receptacle 72 and 73 that is substantially equal to a voltage at the connector power pin receptacle 74.

Figure 8:
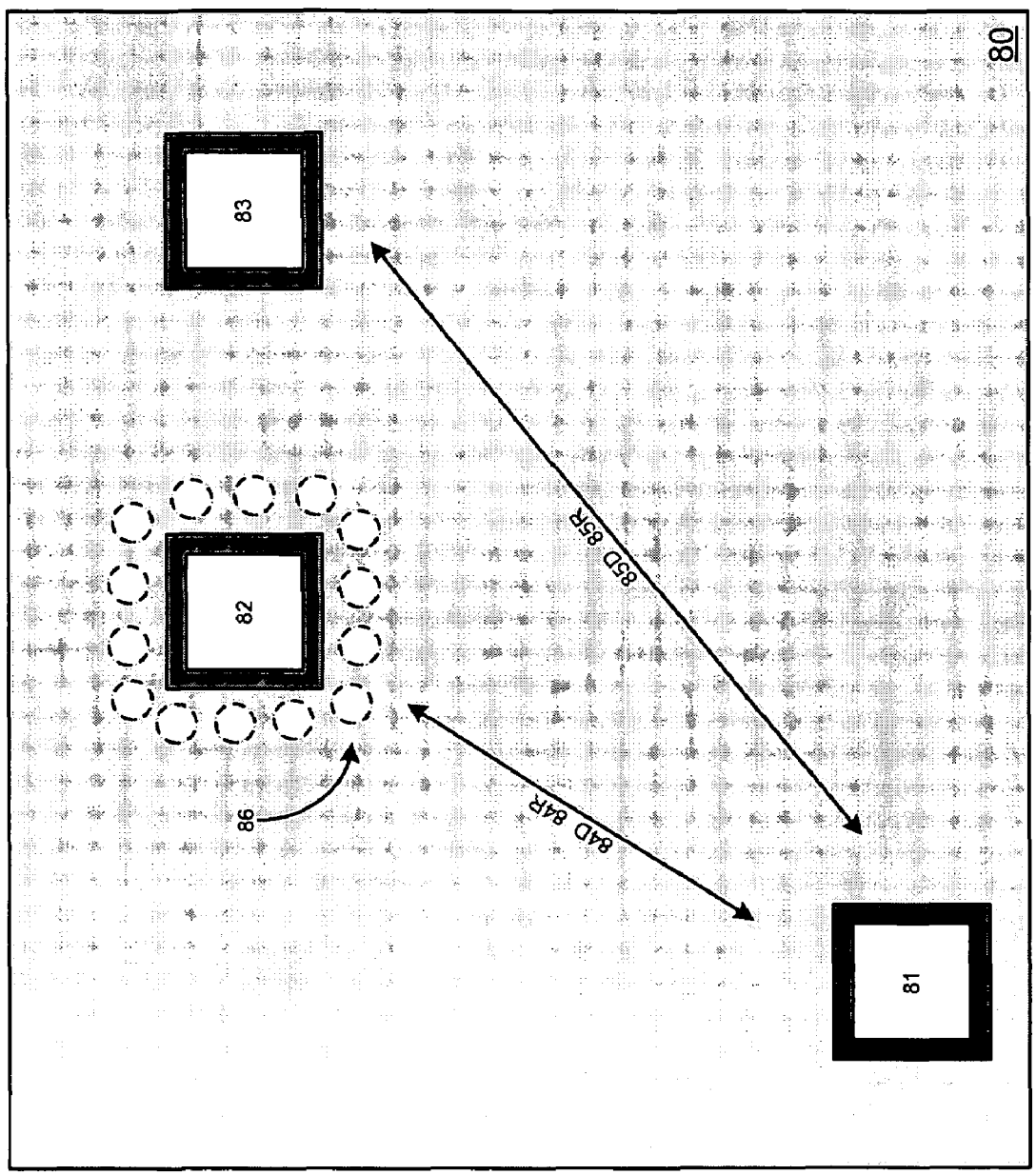
FIG. 8 is a block diagram of a power plane according to some embodiments.

Referring now to FIG. 8, an embodiment of a power plane 80 is shown. The power plane 80 may comprise a sheet of electrically-conductive material. The power plane 80 may define a supply power pin receptacle 81, a first connector power pin receptacle 82, and a second power pin receptacle 83. The power plane 80 may be an element of the motherboard 10.

A first distance 84D of FIG. 8 represents an electrical path between the first connector power pin receptacle 82 and the supply power pin receptacle 81. The first distance 84D may exhibit a first electrical resistance 84R. Similarly, a second distance 85D represents an electrical path between the second connector power pin receptacle 83 and the supply power pin receptacle 81. The second distance 85D may exhibit a second electrical resistance 85R. In some embodiments, the second resistance 85R may be substantially equal to the first resistance 84R and the second distance 85D may be greater than the first distance 84D.

In some embodiments, a plurality of voids 86 may be located around the supply power pin receptacle 81 as shown in FIG. 8. The plurality of voids 86 may increase the resistance associated with distance 84D. The size and shape of the plurality of voids 86 may be selected such that the first resistance 84R is substantially equal to the second resistance 85R. The substantially equal resistances may result in a voltage at the connector power pin receptacle 82 and 84 that is substantially equal to a voltage at the connector power pin receptacle 84.

Various modifications and changes may be made to the foregoing embodiments without departing from the broader spirit and scope set forth in the appended claims.

What is claimed is:

1. An apparatus comprising:
   a power plane, the power plane defining;
      a supply power pin receptacle;
      a first connector power pin receptacle;
      a second connector power pin receptacle;
      a first void; and
      a second void,
   wherein a first distance between the first connector power pin receptacle and the supply power pin receptacle is less than a second distance between the second connector power pin receptacle and the supply power pin receptacle,
wherein a first electrical resistance between the supply power pin receptacle and the first connector power pin receptacle is substantially equal to a second electrical resistance between the supply power pin receptacle and the second connector power pin receptacle, wherein the first void is located between the first connector power pin receptacle and the supply power pin receptacle, wherein the first void is not located between the second connector power pin receptacle and the supply power pin receptacle, wherein the second void is located between the first connector power pin receptacle and the supply power pin receptacle, wherein the second void is not located between the second connector power pin receptacle and the supply power pin receptacle, wherein an area defined by the first void is less than an area defined by the first connector power pin, and wherein an area defined by the second void is less than an area defined by the first connector power pin.

2. The apparatus of claim 1, wherein the first void is circular shaped and the second void is circular shaped.

3. The apparatus of claim 1, wherein a first diameter of the first void is not equal to a second diameter of the second void.

4. A method comprising;
   fabricating a power plane, the power plane defining;
      a supply power pin receptacle;
      a first connector power pin receptacle;
      a second connector power pin receptacle;
      a first void; and
      a second void,
   wherein a first distance between the first connector power pin receptacle and the supply power pin receptacle is less than a second distance between the second connector power pin receptacle and the supply power pin receptacle, and
wherein a first electrical resistance between the supply power pin receptacle and the first connector power pin receptacle is substantially equal to a second electrical resistance between the supply power pin receptacle and the second connector power pin receptacle, wherein the first void is located between the first connector power pin receptacle and the supply power pin receptacle, wherein the first void is not located between the second connector power pin receptacle and the supply power pin receptacle, wherein the second void is located between the first connector power pin receptacle and the supply power pin receptacle, wherein the second void is not located between the second connector power pin receptacle and the supply power pin receptacle, wherein an area defined by the first void is less than an area defined by the first connector power pin, and wherein an area defined by the second void is less than an area defined by the first connector power pin.

5. The method of claim 4, wherein the first void is circular shaped and the second void is circular shaped.

6. The method of claim 4, wherein
the second void is located between the first connector power pin receptacle and the supply power pin receptacle.

7. A system comprising:
a power plane, the power plane defining;
a supply power pin receptacle;
a first connector power pin receptacle;
a second connector power pin receptacle;
a first void;
a second void,
wherein a first distance between the first connector power pin receptacle and the supply power pin receptacle is less than a second distance between the second connector power pin receptacle and the supply power pin receptacle,
wherein a first electrical resistance between the supply power pin receptacle and the first connector power pin receptacle is substantially equal to a second electrical resistance between the supply power pin receptacle and the second connector power pin receptacle, wherein the first void is located between the first connector power pin receptacle and the supply power pin receptacle, wherein the first void is not located between the second connector power pin receptacle and the supply power pin receptacle, wherein the second void is located between the first connector power pin receptacle and the supply power pin receptacle, wherein the second void is not located between the second connector power pin receptacle and the supply power pin receptacle, wherein an area defined by the first void is less than an area defined by the first connector power pin, and wherein an area defined by the second void is less than an area defined by the first connector power pin;
a voltage regulator;
a first double data rate memory module coupled to the first connector power pin receptacle; and
a second double data rate memory module coupled to the second connector power pin receptacle.

8. The system of claim 7, wherein the first void is circular shaped and the second void is circular shaped.

* * * * *